United States Patent
Ma

(10) Patent No.: US 9,413,291 B2
(45) Date of Patent: Aug. 9, 2016

(54) SYSTEM AND METHOD FOR FREQUENCY DRIFT COMPENSATION FOR A DIELECTRIC RESONATOR OSCILLATOR

(71) Applicant: Honeywell International Inc., Morristown, NJ (US)

(72) Inventor: Fu Ma, Shenzhen (CN)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 0 days.

(21) Appl. No.: 14/456,203

(22) Filed: Aug. 11, 2014

(65) Prior Publication Data

US 2016/0043695 A1    Feb. 11, 2016

(51) Int. Cl.
  *H03B 5/04*  (2006.01)
  *H03B 5/30*  (2006.01)
  *H03B 5/18*  (2006.01)

(52) U.S. Cl.
  CPC .............. *H03B 5/04* (2013.01); *H03B 5/1876* (2013.01); *H03B 5/30* (2013.01)

(58) Field of Classification Search
  CPC .............. H01P 7/10; H03B 5/04; H03B 5/30; H03B 5/1876
  USPC .................................... 333/219.1, 234; 331/66
  See application file for complete search history.

(56) References Cited

U.S. PATENT DOCUMENTS

| | | | |
|---|---|---|---|
| 4,011,527 A | 3/1977 | Havens | |
| 4,307,352 A | 12/1981 | Shinkawa et al. | |
| 4,712,078 A | 12/1987 | Slobodnik, Jr. et al. | |
| 6,124,767 A | 9/2000 | Woods | |
| 6,188,296 B1 * | 2/2001 | Nibe ..................... | H03B 5/1876 331/117 D |
| 6,362,708 B1 * | 3/2002 | Woods ......................... | 333/234 |
| 6,600,394 B1 * | 7/2003 | Wang et al. ................... | 333/235 |
| 2009/0278631 A1 * | 11/2009 | Goebel et al. ................. | 333/229 |

FOREIGN PATENT DOCUMENTS

JP    2000-13139 A    1/2000

OTHER PUBLICATIONS

English-language translation of the abstract for foreign patent JP 2000-13139A.
extended European search report for corresponding EP patent application 15179576.2, dated Dec. 10, 2015.

* cited by examiner

*Primary Examiner* — Jeffrey Shin
(74) *Attorney, Agent, or Firm* — Husch Blackwell LLP

(57) ABSTRACT

Systems and methods for frequency drift compensation for a dielectric resonator oscillator and systems and methods to reduce temperature drift in a dielectric resonator oscillator are provided. Some systems can include an oscillator circuit and a dielectric resonator electrically coupled to the oscillator circuit. The oscillator circuit can have a first temperature coefficient, and the dielectric resonator can have a second temperature coefficient to compensate for frequency drift caused by the first temperature coefficient of the oscillator circuit.

18 Claims, 2 Drawing Sheets

SYSTEM AND METHOD FOR FREQUENCY DRIFT COMPENSATION FOR A DIELECTRIC RESONATOR OSCILLATOR

FIELD

The present invention relates generally to a dielectric resonator oscillator. More particularly, the present invention relates to a system and method for frequency drift compensation for a dielectric resonator oscillator.

BACKGROUND

An oscillator is a core device in a microwave transceiver. Moreover, phase noise and high stability of the signal source or a local source play a decisive role in the entire microwave system, especially in a low cost dielectric resonator oscillator (DRO).

In a DRO, the permitted range of operating frequencies is critical throughout an entire temperature range. The permitted range of operating frequencies can be understood as signal bandwidth (MHz) plus temperature drift (MHz). Accordingly, if the temperature drift is reduced, then the permitted range of operating frequencies can be reduced accordingly.

Some known systems and methods to reduce temperature drift include applying a thermistor and changing the voltage in a bias circuit for temperature and frequency compensation. However, these systems and methods introduce an additional device (the thermistor), introduce unexpected noise, increase the area of a printed circuit board (PCB), and increase the cost of the device while only providing only a small compensation range.

Other known systems and methods to reduce temperature drift include reducing the temperature coefficient of a dielectric resonator (DR), for example, with the use of a low temperature coefficient, high stability, and high performance DR to achieve a small drift. However, these systems and methods require higher quality materials, which increase the cost of the device. Furthermore, these systems and methods can only stabilize frequency, but cannot compensate for frequency drift.

In view of the above, there is a continuing, ongoing need for improved systems and methods to reduce temperature drift in a DRO.

DETAILED DESCRIPTION

Figure 1:
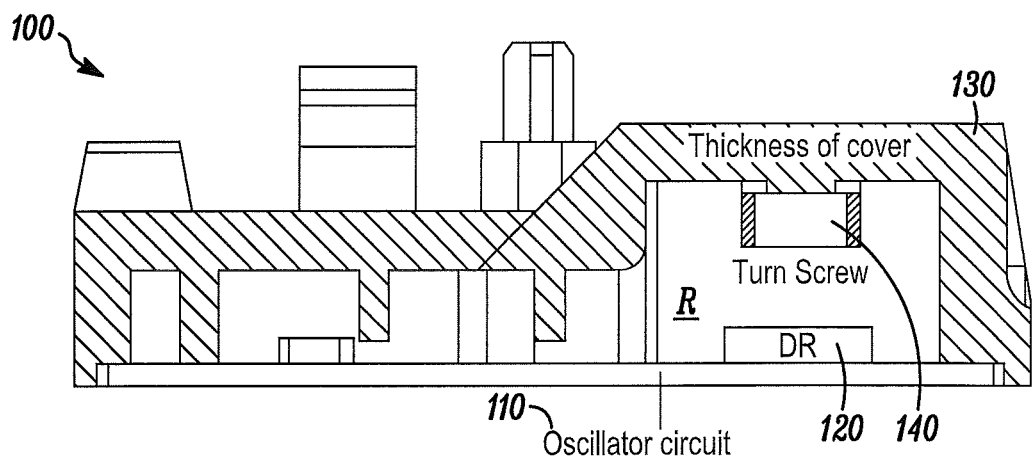
FIG. 1 is a side view of a microwave module in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein include improved systems and methods for frequency drift compensation for a DRO and systems and methods to reduce temperature drift in a DRO. For example, some systems and methods disclosed herein can improve frequency stability when the DRO operates in an entire temperature range.

In some embodiments, systems and methods disclosed herein can meet the requirements set forth in EN 300440 as well as the ERC recommended requirement for the permitted range of operating frequencies in, for example, France and the United Kingdom. For example, some systems and methods disclosed herein can meet the requirement of a permitted range of operating frequencies that is maximum 20 MHz from −20° C. to 55° C. Accordingly, if the bandwidth is approximately 8 MHz, then systems and methods disclosed herein can control frequency drift to less than approximately 10 MHz at extreme conditions.

In some embodiments, systems and methods disclosed herein can be implemented without increasing the cost of a known DRO but while significantly improving the frequency stability when the DRO operates in a whole temperature range. For example, some embodiments can include a microwave oscillator system and a DR that has a temperature drift characteristic to offset the oscillator system, thereby reducing the temperature drift of the microwave module.

FIG. 1 is a side view of a microwave module 100 in accordance with disclosed embodiments. As seen in FIG. 1, the module 100 can include an oscillator circuit 110 deposited on a PCB and a DR 120 electrically coupled to the oscillator circuit 110. The DR 120 can be housed in a region R that is defined by a shielding cover 130, which can include a tuning screw 140 inserted therein.

When the temperature of the environment in which the module 100 is located changes, the oscillation frequency of the oscillator circuit 110 can drift with the temperature. Accordingly, the following factors can influence the frequency drift of the circuit 110: (1) the temperature characteristic of the microwave device, for example, an FET, (2) the PCB material temperature characteristics, and (3) the temperature change in the environment. For example, when the temperature of the environment changes, the dielectric constant of the PCB can change, resulting in input and output impedance of the oscillator circuit 110 and a change in oscillation frequency. Furthermore, when the temperature of the environment changes, the shielding cover 130 can expand and contract, and these characteristics can change the distance between the tuning screw 140 and the DR 120 within the region R, thereby resulting in frequency drift.

Figure 2:
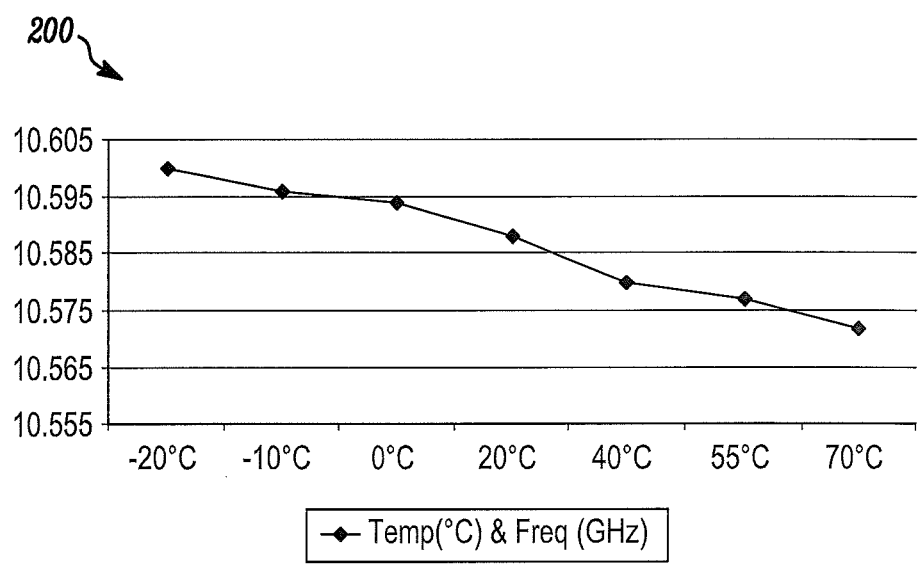
FIG. 2 is a graph of oscillation frequency drift.

FIG. 2 is a graph 200 of oscillation frequency drift. As seen in FIG. 2, the above-identified factors influencing the frequency drift of the circuit 110 can cause the oscillation frequency of the circuit 110 to drift approximately 30 MHz from approximately −20° C. to approximately 70° C. As also seen in FIG. 2, the oscillator circuit 110 can have a temperature characteristic that includes a negative temperature coefficient.

Figure 3:
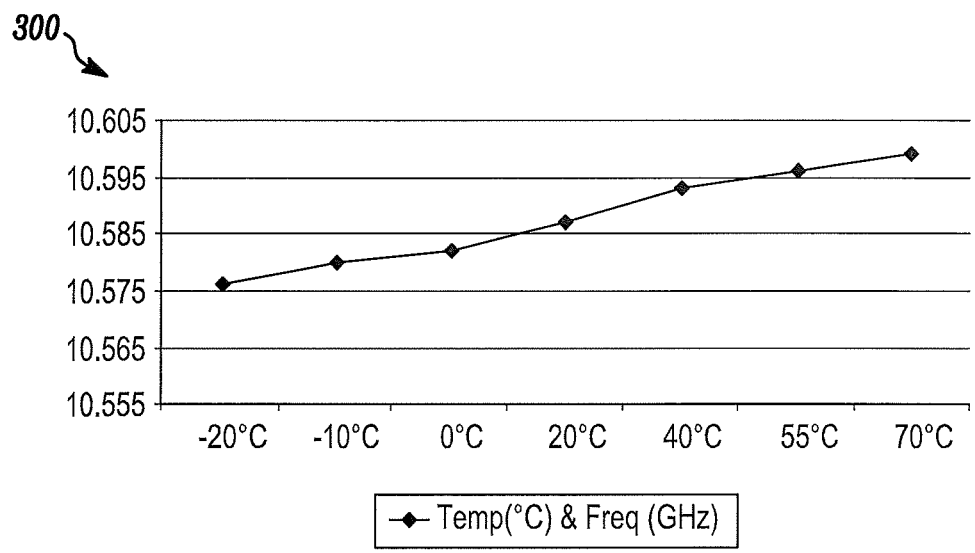
FIG. 3 is a graph of the temperature coefficient of a dielectric resonator in accordance with disclosed embodiments.

FIG. 3 is a graph 300 of the temperature coefficient of the DR 120 in accordance with disclosed embodiments. Because the oscillator circuit 110 has a negative temperature coefficient, in some embodiments, the DR 120 employed in systems and methods disclosed herein can be selected to have a high and/or positive temperature coefficient. Accordingly, the DR 120 in accordance with disclosed embodiments can compensate for frequency drift caused by the negative temperature characteristic of the circuit 110.

Similarly, in embodiments in which the oscillator circuit 110 has a positive temperature coefficient, a DR 120 can be employed in systems and methods disclosed herein with a negative temperature coefficient to compensate for frequency drift. Accordingly, in systems and methods disclosed herein, a DR 120 can be selected and employed based on the temperature characteristics of the system in which the DR 120 is to be used.

In some embodiments, the temperature coefficient of the DR 120 can be calculated as $\Delta F/F0 * 1/\Delta T$. In embodiments disclosed herein, a positive temperature coefficient of the DR can be selected and $\Delta F$ can compensate for frequency drift introduced by the circuit 110.

Figure 4:
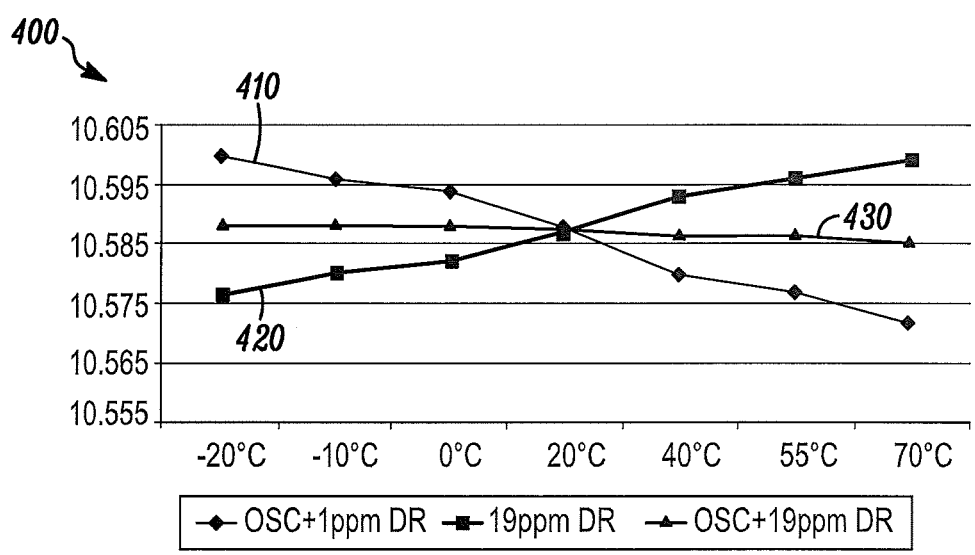
FIG. 4 is a graph of the frequency drift and the temperature coefficient of a microwave module in accordance with disclosed embodiments.

FIG. 4 is a graph 400 of the frequency drift and the temperature coefficient of the microwave module 100 in accordance with disclosed embodiments. As seen in FIG. 4, the curve 410 can represent the temperature coefficient of the oscillator circuit 110, the curve 420 can represent the temperature coefficient of the DR 120, and the curve 430 can represent the temperature coefficient of the microwave module 100 of which the circuit 110 and the DR 120 are a part. Accordingly, as seen, systems and methods disclosed herein can achieve frequency stability.

In accordance with the above, systems and methods for frequency drift compensation in a microwave oscillator circuit can be achieved at a low cost and without the addition of a thermistor and/or a high performance DR to the circuit. For example, when given a negative temperature coefficient in the oscillator system, including in the mechanical structure, a high and/or positive temperature coefficient in the DR can be applied as compensation. After the compensation in accordance with embodiments disclosed herein, frequency drift can be less than approximately 10 MHz, which is more than 95% improvement as compared to known systems and methods.

Indeed, in some embodiments disclosed herein, the oscillator system, including the oscillator circuit, the FET, the PCB, and/or the frequency drift introduced by the mechanical structure of the circuit can all be compensated by the DR. For example, in some embodiments, the temperature coefficient of at least one of the oscillator circuit, the FET, the PCB, and the mechanical structure can be compensated substantially simultaneously.

Although a few embodiments have been described in detail above, other modifications are possible. For example, the logic flows described above do not require the particular order described, or sequential order, to achieve desirable results. Other steps may be provided, or steps may be eliminated, from the described flows, and other components may be added to, or removed from, the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the sprit and scope of the invention.

What is claimed is:

1. A system comprising:
   a printed circuit board having at least a first side and a second side;
   an oscillator circuit disposed on the first side of the printed circuit board; and
   a dielectric resonator disposed on the first side of the printed circuit board;
   wherein the dielectric resonator is electrically coupled to the oscillator circuit,
   wherein the oscillator circuit has a first temperature coefficient,
   wherein the dielectric resonator has a second temperature coefficient to compensate for frequency drift caused by the first temperature coefficient of the oscillator circuit,
   wherein the second temperature coefficient is calculated by $\Delta F/F0 * 1/\Delta T$, and
   wherein $\Delta F$ is change in frequency, F0 is a starting frequency, and $\Delta T$ is change in temperature.

2. The system of claim 1 further comprising a shielding cover, wherein the dielectric resonator and the oscillator circuit are housed in a region defined by the shielding cover.

3. The system of claim 2 further comprising a tuning screw inserted in the shielding cover.

4. The system of claim 1 wherein an oscillation frequency of the oscillator circuit drifts as much as 30 MHz from −20° C. to 70° C.

5. The system of claim 1 wherein the first temperature coefficient is a negative temperature coefficient, and wherein the second temperature coefficient is a positive temperature coefficient.

6. The system of claim 1 wherein the first temperature coefficient is a positive temperature coefficient, and wherein the second temperature coefficient is a negative temperature coefficient.

7. The system of claim 1 wherein an oscillation frequency of the oscillator circuit drifts according to temperature change.

8. The system of claim 1 further comprising a microwave module housing the oscillator circuit and the dielectric resonator, wherein the microwave module achieves frequency stability.

9. The system of claim 8 wherein the microwave module has a maximum range of operating frequencies of 20 MHz from −20° C. to 55° C.

10. The system of claim 8 wherein a frequency drift of the microwave module is less than 10 MHz.

11. A method comprising:
    providing a printed circuit board having at least a first side and a second side;
    providing an oscillator circuit disposed on the first side of the printed circuit board, with the oscillator circuit having a first temperature coefficient; and
    compensating for frequency drift caused by the first temperature coefficient of the oscillator circuit by providing a dielectric resonator disposed on the first side of the printed circuit board, electrically coupling the dielectric resonator to the oscillator circuit, and selecting the dielectric resonator to have a second temperature coefficient,
    wherein the second temperature coefficient is calculated by $\Delta F/F0 * 1/\Delta T$, and
    wherein $\Delta F$ is change in frequency, F0 is a starting frequency, and $\Delta T$ is change in temperature.

12. The method of claim 11 further comprising an oscillation frequency of the oscillator circuit drifting as much as 30 MHz from −20° C. to 70° C.

13. The method of claim 11 wherein the first temperature coefficient is a negative temperature coefficient, and wherein the second temperature coefficient is a positive temperature coefficient.

14. The method of claim 11 wherein the first temperature coefficient is a positive temperature coefficient, and wherein the second temperature coefficient is a negative temperature coefficient.

15. The method of claim 11 further comprising an oscillation frequency of the oscillator circuit drifting according to temperature change.

16. The method of claim 11 further comprising:
provide a microwave module to house the oscillator circuit and the dielectric resonator; and
the microwave module achieving frequency stability.

17. The method of claim 16 further comprising achieving a maximum range of operating frequencies for the microwave module of 20 MHz from −20° C. to 55° C.

18. The method of claim 16 further comprising achieving a frequency drift of the microwave module of less than −10 MHz.

* * * * *